United States Patent
Tabata et al.

(10) Patent No.: US 10,879,085 B2
(45) Date of Patent: Dec. 29, 2020

(54) GAS GENERATION APPARATUS

(71) Applicant: Toshiba Mitsubishi-Electric Industrial Systems Corporation, Chuo-ku (JP)

(72) Inventors: Yoichiro Tabata, Tokyo (JP); Yuji Ono, Tokyo (JP); Takasho Sato, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 0 days.

(21) Appl. No.: 16/347,703

(22) PCT Filed: Dec. 19, 2016

(86) PCT No.: PCT/JP2016/087706
§ 371 (c)(1),
(2) Date: May 6, 2019

(87) PCT Pub. No.: WO2018/116335
PCT Pub. Date: Jun. 28, 2018

(65) Prior Publication Data
US 2019/0259637 A1 Aug. 22, 2019

(51) Int. Cl.
*H01L 21/67* (2006.01)
*C01B 13/11* (2006.01)

(52) U.S. Cl.
CPC ........ *H01L 21/67017* (2013.01); *C01B 13/11* (2013.01); *C01B 2201/32* (2013.01); *C01B 2201/64* (2013.01); *C01B 2201/90* (2013.01)

(58) Field of Classification Search
None
See application file for complete search history.

(56) References Cited

U.S. PATENT DOCUMENTS

2001/0007645 A1* 7/2001 Honma ................... C23C 16/40
422/186.09
2007/0134140 A1 6/2007 Tabata et al.
(Continued)

FOREIGN PATENT DOCUMENTS

| CN | 102770369 A | 11/2012 |
|----|-------------|---------|
| JP | 2009-500855 A | 1/2009 |

(Continued)

OTHER PUBLICATIONS

International Search Report dated Jan. 31, 2017 in PCT/JP2016/087706 filed Dec. 19, 2016.
(Continued)

*Primary Examiner* — Kishor Mayekar
(74) *Attorney, Agent, or Firm* — Xsensus LLP

(57) ABSTRACT

Six gas generator units each including a gas generator, one unit of multiple AC power supply section that supplies six high frequency AC voltages to the six gas generator units, one unit of gas control section that controls raw material gas and output gas in the six gas generator units, and one unit of control/operation section constituting section that performs an AC power control operation to allow six high frequency AC voltages having desired electric energy, independent from each other, to be supplied. The six gas generator units, one unit of multiple AC power supply section, one unit of gas control section, and one unit of control/operation section constituting section are integrally provided.

10 Claims, 8 Drawing Sheets

(56) References Cited

U.S. PATENT DOCUMENTS

2012/0219460 A1    8/2012  Okihara et al.
2014/0341782 A1  11/2014  Okihara et al.

FOREIGN PATENT DOCUMENTS

| JP | 2014-122157 A | 7/2014 |
|---|---|---|
| WO | WO 2006/035506 A1 | 4/2006 |
| WO | WO 2007/008561 A2 | 1/2007 |
| WO | WO 2011/065087 A1 | 6/2011 |

OTHER PUBLICATIONS

Taiwanese Office Action dated Jan. 16, 2018 in Taiwanese Application No. 106116675 (with partial unedited computer-generated English translation), citing document AT therein, 8 pages.
International Preliminary Report on Patentability dated Jul. 4, 2019 in PCT/JP2016/087706 (with English translation).

\* cited by examiner

GAS GENERATION APPARATUS

TECHNICAL FIELD

The present invention relates to a gas generation apparatus equipped with a plurality of gas generator units.

BACKGROUND ART

In a semiconductor manufacturing apparatus, when dry cleaning, etching treatment, resist peeling treatment, or insulating thin film treatment is performed on a wafer surface, various gas generators such as gas generators using discharges and having different concentrations and flow rates of the generated gases have been utilized. In a plurality of semiconductor manufacturing processes, a plurality of gas generators are becoming required.

Consideration is given on the case where a plurality of gases are supplied to a multi-gas treatment step requiring supply of a gas such as ozone, represented by a semiconductor manufacturing process step or the like. In this case, it is generally conceivable to construct a gas supply system in which a plurality of gas generating mechanisms each including a gas generator, a gas generation power supply, a flow rate controller (MFC), and the like are provided corresponding to a multi-gas treatment step, and each gas generating mechanism corresponds thereto independently.

That is, in order to correspond to the multi-gas treatment step, the gas supply system needs to have a plurality of gas generators, gas generation power supplies, raw material gas piping systems for supplying gas to the gas generators via MFCs for controlling the flow rate of the raw material gas or the like, concentration detectors for output gases that are gases generated from the gas generators, output gas piping systems having flow meters.

In order to construct a gas generation system by discharging or the like corresponding to such a multi-gas treatment step, it is necessary to have a very large space. Furthermore, in the case of constructing a system for supplying generated gas by performing comprehensive control on the multi-gas treatment step, the system configuration becomes larger. This causes problems in terms of cost, installation space, and the like. Therefore, there are many disadvantages in practical use.

Conventionally, a first-generation gas generation apparatus corresponding to a multi-gas treatment step is realized by mounting a plurality of unit groups each including a gas generator unit, a gas generation power supply unit, a gas control unit, and an electric control unit. Note that the gas control unit is a unit in which a raw material gas piping system for supplying the raw material gas to the gas generator via an MFC or the like that controls the flow rate of the raw material gas, a concentration detector for the output gas that is a gas generated from the gas generator in the gas generation unit, an output gas piping system having a flow meter, and the like are integrated. The electric control unit is a unit that controls the gas control unit and the concentration and the gas amount of the output gas.

Such a first-generation gas generation apparatus is required to be configured of a plurality of unit groups as described above, so that the apparatus configuration becomes large. Therefore, it is difficult to increase the number of unit groups.

In a second-generation gas generation apparatus corresponding to a multi-gas treatment step, ozone gas is supplied as a gas supply method to the multi-gas treatment step. As a gas generation apparatus equipped with a plurality of gas generator units, an ozone system disclosed in Patent Document 1 and an ozone gas supply system disclosed in Patent Document 2 are cited.

For example, in the case of the ozone system disclosed in Patent Document 1, an ozone gas supply system is adopted in which the capacity of a single-type ozone generator is increased, and the piping system for outputting the ozone gas is separated into a plurality of pipes, whereby the ozone gas having a predetermined flow rate and a predetermined concentration is output to a multi-ozone treatment apparatus in a stepwise manner.

Further, in the case of the ozone gas supply system disclosed in Patent Document 2, the system adopts a configuration in which a single-type ozone generation unit is integrally provided with a gas generator, gas generation power supply, a raw material gas piping system for supplying gas to the gas generator via an MFC or the like that controls the raw material gas flow rate, a generated gas concentration detector for output gas that is the gas generated from the gas generator, a flow meter, and the like, and the ozone generation units are mounted in multiple stages.

PRIOR ART DOCUMENTS

Patent Documents

Patent Document 1: Published Japanese Translation of PCT International Application No. 2009-500855 (FIGS. 2, 3, 5)

Patent Document 2: International Publication No. 2011/065087

SUMMARY

Problem to be Solved by the Invention

In the above-described first-generation gas generation apparatus, in order to supply a gas, a necessary gas generating section, a power supply section for generating a gas, a gas supply/output control section, and an electric control section for managing the entire apparatus are unitized to form one unit of gas generation mechanism. If a plurality of unitized units having different functions as described above are combined into one unit of gas generating mechanism, in order to install a plurality of gas generating mechanisms and to output a gas of independent specification, it is necessary to mount a plurality of units having divided functions. This causes a problem that the space for the gas generation apparatus including a plurality of gas generating mechanisms is increased.

One solution to the above problem may be the ozone system disclosed in Patent Document 1 which is a second-generation gas generation apparatus (part 1). As described above, the ozone system disclosed in Patent Document 1 adopts a configuration in which a gas generated from one gas generator is output, and a piping system for output includes distribution pipes. For this reason, the generated gas flow rate and the generated gas concentration must be supplied to the multi-gas treatment apparatus in a fixed state. Therefore, there is a problem that the treatment gas supply condition to each gas treatment apparatus is shared under only one condition, and it is impossible to variably control the generated gas flow rate and the concentration independently for the corresponding gas treatment apparatus.

Further, in the ozone system disclosed in Patent Document 1, since the gas generated from one gas generator is supplied to a multi-gas treatment apparatus, if the gas generator fails, gas supply to all the gas treatment apparatuses to be supplied must be stopped, for example. Accordingly, there is a problem that reliability regarding gas supply is low.

Another solution to the above problem is the ozone gas supply system disclosed in Patent Document 2 which is a second-generation gas generation apparatus (part 1). The ozone gas supply system is configured as described above, and since the integrated ozone generation units are mounted in multiple stages, it is possible to variably control the generated gas flow rate and the concentration while the respective gas treatment apparatuses are used individually.

However, since each of the ozone generation units has all the functions of peripheral equipment necessary for generating ozone, it is necessary to provide peripheral equipment for each unit, so that the number of peripheral devices cannot be reduced for downsizing the entire apparatus, and there are limitations in the production cost or the like. Therefore, there are problems that the weight of each ozone generation unit becomes heavy, and it takes time for repair maintenance.

It is an object of the present invention to solve the above-described problems and to provide a gas generation apparatus equipped with a plurality of gas generator units while achieving downsizing of the entire apparatus.

Means to Solve the Problem

A gas generation apparatus according to the present invention is a gas generation apparatus having a plurality of gas generator units each including a gas generator that generates an output gas. The apparatus includes a multiple AC power supply section that is shared by the plurality of gas generator units and supplies a plurality of AC voltages to the plurality of gas generator units, and a gas control section that is shared by the plurality of gas generator units and controls a raw material gas supplied to the plurality of gas generator units and the output gas generated by the plurality of gas generator units. The gas control section includes a plurality of mass flow controllers provided corresponding to the plurality of the gas generator units, each of the mass flow controllers controlling a raw material gas flow rate that is a flow rate of the raw material gas input to a corresponding gas generator unit, a plurality of auto pressure controllers provided corresponding to the plurality of gas generator units, each of the auto pressure controllers controlling an internal pressure that is a pressure inside the gas generator of a corresponding gas generator unit, and a plurality of gas densitometers provided corresponding to the plurality of gas generator units, each of the gas densitometers detecting a concentration of the output gas output by the gas generator of a corresponding gas generator unit as a detected concentration. The gas generation apparatus further includes an AC power supply control section that performs an AC power control operation on the multiple AC power supply section. The AC power control operation includes an operation of controlling the electric energy of a corresponding AC voltage, based on the detected concentration detected by a corresponding gas densitometer. The plurality of gas generator units, the multiple AC power supply section, the gas control section, and the AC power supply control section are integrally provided.

Effects of the Invention

In the gas generation apparatus according to the present invention, with respect to a plurality of gas generator units, a multiple AC power supply section, a gas control section, and an AC power supply control unit, each of which is in one unit, are integrally formed. Accordingly, it is possible to mount a plurality of gas generator units while realizing a shared power supply section and an integrated arrangement of the gas control section and making the entire apparatus compact.

Objects, features, aspects, and advantages of the present invention will become more apparent from the following detailed description and the accompanying drawings.

DESCRIPTION OF EMBODIMENTS

First Embodiment

Figure 1:
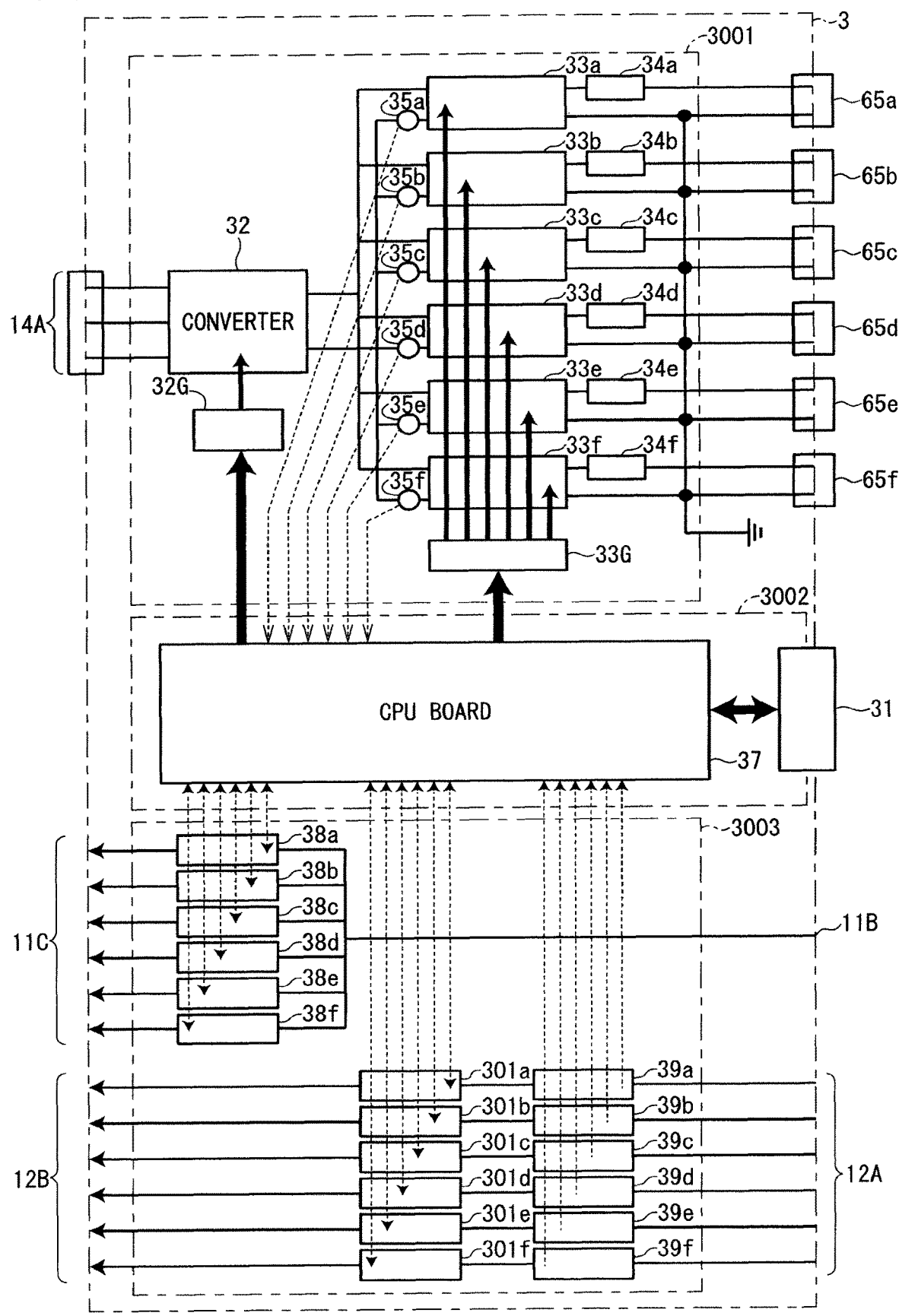
FIG. 1 is an explanatory diagram schematically showing an internal configuration of a power supply/gas control unit of a gas generation apparatus according to a first embodiment of the present invention.
Figure 2:
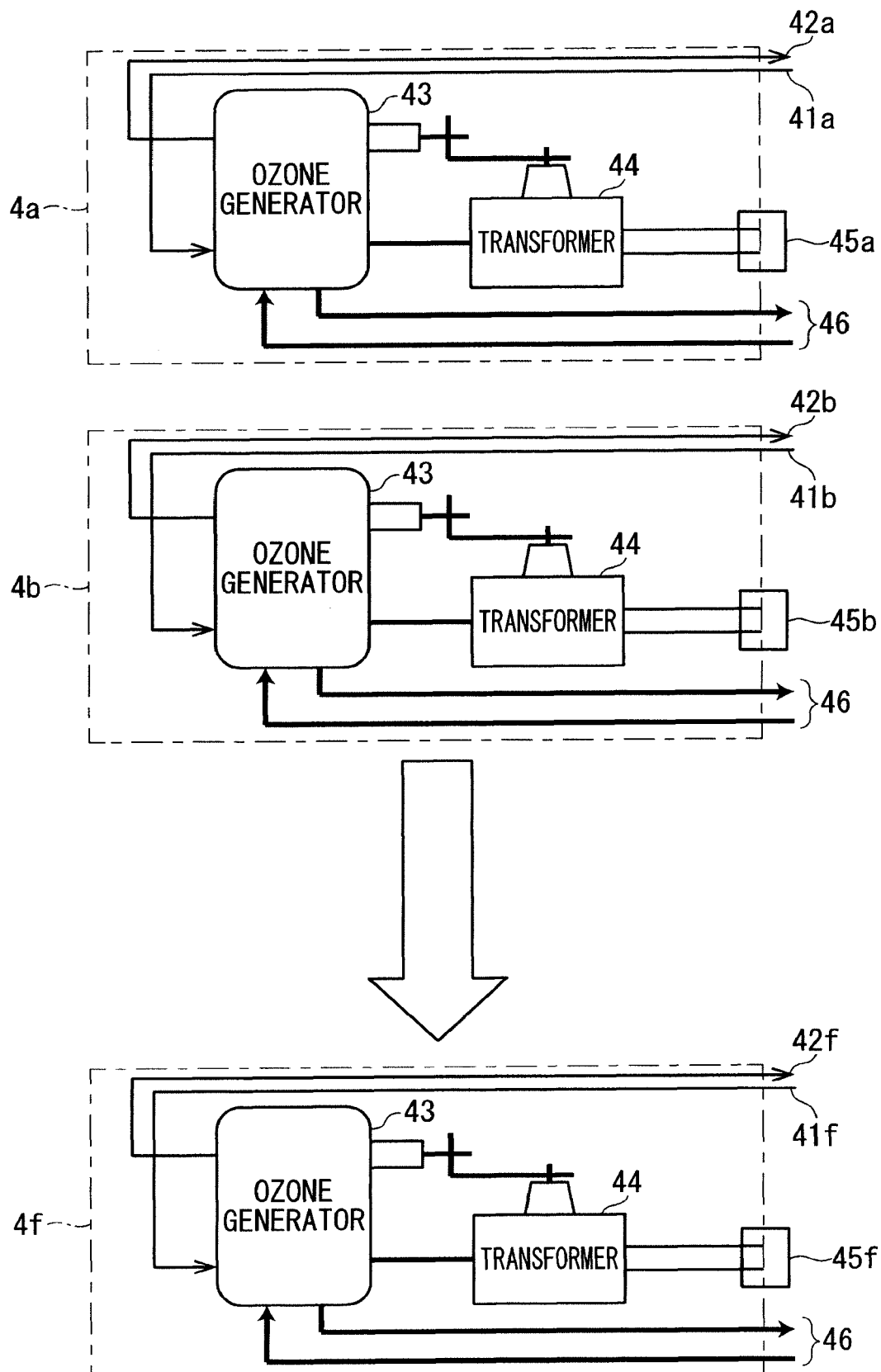
FIG. 2 is an explanatory diagram schematically showing a configuration of a plurality of gas generator units of the gas generation apparatus of the first embodiment.
Figure 3:
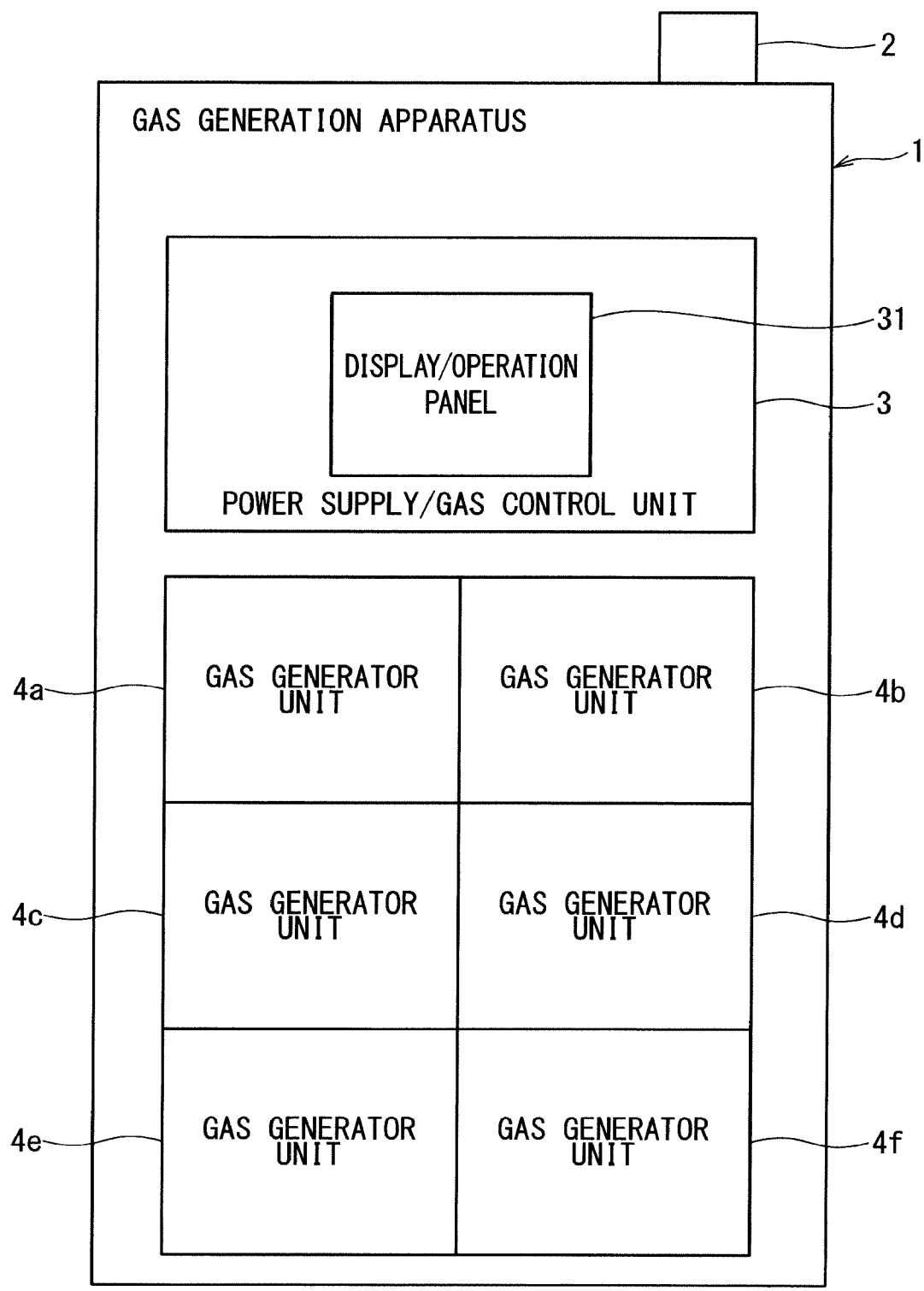
FIG. 3 is an explanatory diagram showing an outline of an exemplary arrangement of respective constituent parts viewed from the front of the gas generation apparatus of the first embodiment.
Figure 4:
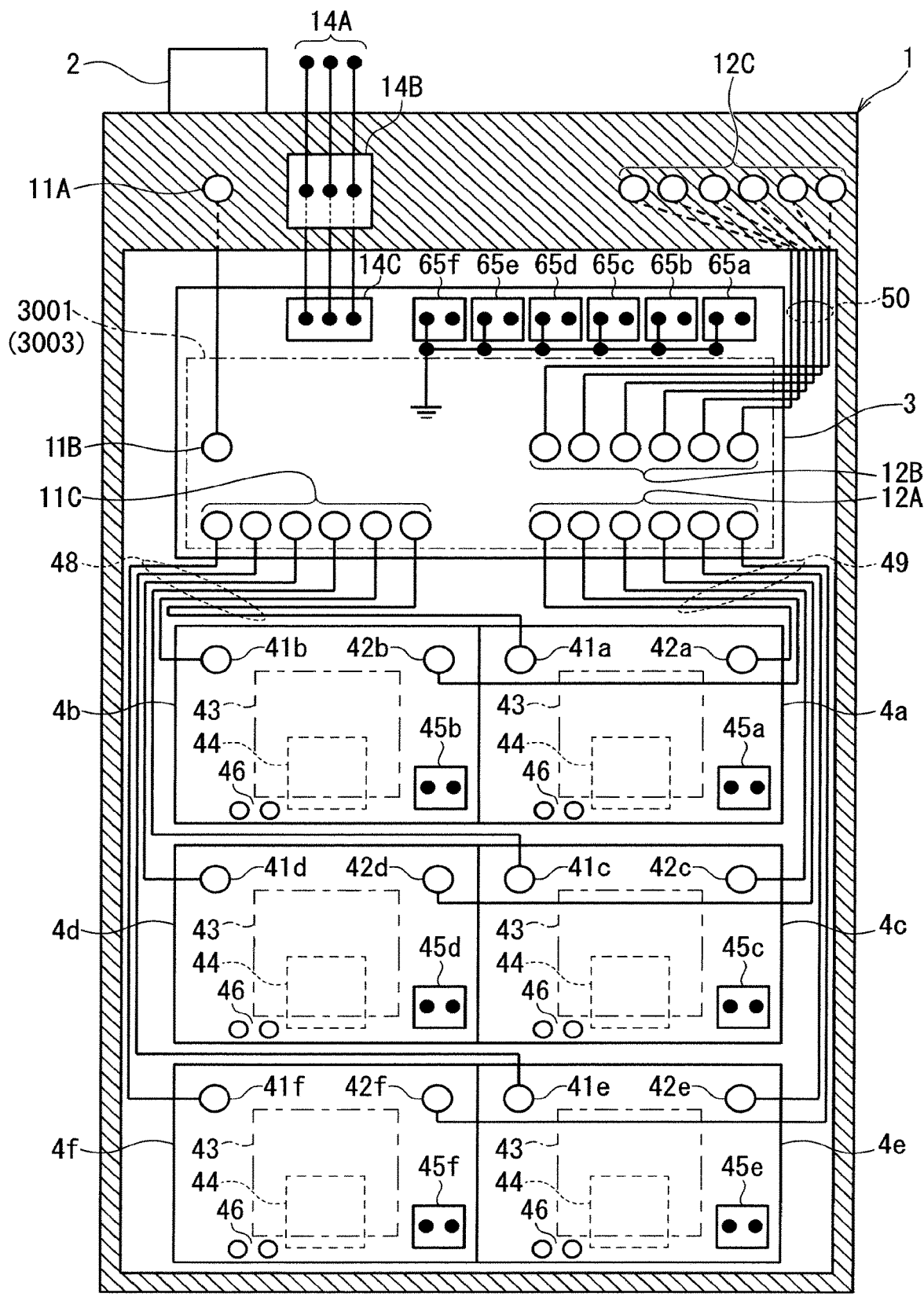
FIG. 4 is an explanatory diagram showing an outline of an exemplary arrangement of respective constituent parts and pipes viewed from the back side of the gas generation apparatus of the first embodiment.

A gas generation apparatus according to a first embodiment of the present invention will be described with reference to FIGS. 1 to 4. The outlines of FIGS. 1 to 4 are as follows. FIG. 1 is an explanatory diagram schematically showing the internal configuration of a power supply/gas control unit of the gas generation apparatus according to the first embodiment of the present invention. FIG. 2 is an explanatory diagram schematically showing a configuration of a plurality of gas generator units of the gas generation apparatus of the first embodiment. FIG. 3 is an explanatory diagram showing the outline of an exemplary arrangement of the respective constituent parts viewed from the front side of the gas generation apparatus of the first embodiment. FIG. 4 is an explanatory diagram showing the outline of an exemplary arrangement of the pipes of the respective constituent parts viewed from the back side of the gas generation apparatus of the first embodiment.

(Overall Configuration)

As an overall configuration of the present invention, as shown in FIGS. 3 and 4, an exemplary arrangement of a power supply/gas control unit 3 and six gas generator units 4a to 4f (a plurality of gas generator units) each having a gas generator (ozone generator) 43 in the gas generation apparatus 1 of the first embodiment is shown, and an arrangement configuration of gas pipes and an arrangement configuration of electric wires are shown.

Hereinafter, the power supply/gas control unit 3 and the gas generator units 4a to 4f in the gas generation apparatus 1 will be described with reference to FIGS. 1 and 2.

As shown in FIG. 2, the gas generator units (ozone gas generator units) 4a to 4f each have the same configuration. Hereinafter, the gas generator unit 4a will be described as a representative. The gas generator unit 4a has a gas generator (ozone generator) 43 and a transformer 44 as main components. A raw material gas is input from a raw material supply port 41a connected by piping, and a generated ozone gas is output as an output gas from a gas output port 42a connected by piping. Further, the gas generator (ozone generator) 43 is cooled by a circulating cooling water pipe 46.

The transformer 44 receives a high frequency AC voltage output from the power supply/gas control unit 3 on the primary side of the transformer via a terminal 45, and the high frequency AC voltage is boosted to a high voltage on the secondary side of the transformer. By applying the voltage, boosted to the high voltage, between the high voltage terminal of the gas generator 43 and a grounded part (body part), dielectric barrier discharge is generated in the gas space portion (discharge space portion) formed between the electrodes provided in the gas generator 43. Thereby, ozone gas, that is to be an output gas, is generated by converting the raw material gas supplied into the gas space portion into the ozone gas.

When the voltage is boosted to a high voltage by the transformer 44, resonance is made by the inductance of the transformer 44 and the capacitance built in the gas generator 43, whereby it is possible to increase the power factor of the power supply section and obtain a high voltage with high efficiency.

In the following description, when the gas generator units 4a to 4f are referred to individually or collectively, they may be simply referred to as a "gas generator unit 4".

In the first embodiment, description is given on the configuration, operation, and the like of the gas generator units 4a to 4f functioning as multi-chamber generation units, based on the premise that a raw material gas is a high-purity oxygen gas and a gas generator is a nitrogen-less high-purity gas generator 43.

Next, the configuration of one power supply/gas control unit 3 installed in the gas generation apparatus 1 will be described with reference to FIG. 1.

As shown in FIG. 1, the power supply/gas control unit 3 includes a multiple AC power supply section 3001, a control/operation section constituting section 3002, and a gas control section 3003.

The control/operation section constituting section 3002 is configured of a display/operation panel 31 and a CPU board 37.

In the gas control section 3003, MFCs (Mass Flow Controllers) 38a to 38f receive the raw material gas from a raw material gas supply port 11B. The MFCs 38a to 38f are provided corresponding to the gas generator units 4a to 4f one to one. The gas flow rate of the raw material gas supplied to the gas generators (ozone generators) 43 of the respective gas generator units 4a to 4f is divided for the MFCs 38a to 38f, and the raw material gas is supplied to the corresponding gas generator unit 4 via the raw material gas piping port 11C of each of the gas generator units 4a to 4f. In the following description, when the MFCs 38a to 38f are referred to individually or collectively, they may be simply referred to as an "MFC 38".

To each MFC 38, a gas flow rate setting signal based on a signal instructed from the display/operation panel 31 is sent from the CPU board 37. The flow rate of the material gas passing through the MFC 38 is controlled to be the raw material gas flow rate indicated by the gas flow rate setting signal. Further, at the time of inputting to the MFC 38, a detected gas flow rate signal value of the raw material gas detected in the MFC 38 is returned to the display/operation panel 31 via the CPU board 37. Based on the detected gas flow rate, the CPU board 37 displays the flow rate of the raw material gas flowing through the gas generator 43 of each gas generator unit 4 on the display/operation panel 31, to thereby manage the flow rate of the raw material gas.

Also, the output gas, which is ozone gas generated from the gas generator 43 of each gas generator unit 4, is received by a pipe 12A, and is output from a pipe 12B via gas densitometers 39a to 39f and APCs (Auto Pressure Controllers) 301a to 301f. The gas densitometers 39a to 39f and the APCs 301a to 301f are provided one-to-one corresponding to the gas generator units 4a to 4f, respectively. In the following description, when the gas densitometers 39a to 39f are referred to individually or collectively, they may be simply referred to as a "gas densitometer 39", and when the APCs 301a to 301f are referred to individually or collectively, they may be simply referred to as an "APC 301".

The detected concentration (signal) detected by each gas densitometer 39 is sent to the display/operation panel 31 via the CPU board 37. Based on the detected concentration, the CPU board 37 displays the state of the output gas concentration that is an ozone gas concentration generated in each gas generator unit 4, on the display/operation panel 31.

As described above, the gas densitometers 39a to 39f are provided corresponding to the gas generator units 4a to 4f, and each of them detects the concentration of the output gas output from the gas generator 43 of the corresponding gas generator unit 4.

On the basis of a signal instructed by the display/operation panel 31, a gas pressure setting signal is sent from the CPU board 37 to the APC 301a to 301f. Thereby, the output gas pressure on the output side (upstream side) of the corresponding gas generator 43 is controlled so as to realize the output gas pressure instructed by the gas pressure setting signal. Further, the detected pressure detected in the APC 301 at the time of inputting by the APC 301 is returned to the display/operation panel 31 via the CPU board 37. Based on the detected pressure, the CPU board 37 displays the pressure of the output gas output from the gas generator 43 of each gas generator unit 4 on the display/operation panel 31, to thereby manage the output gas pressure.

The gas pressure control using the APCs 301a to 301f is pressure control to control the output gas pressure on the output side of the gas generator 43 of each gas generator unit 4 to thereby allow the internal pressure that is a pressure inside the gas generator 43 to be a predetermined pressure P consequently.

As shown in FIG. 1, in the multiple AC power supply section 3001, a commercial AC voltage corresponding to a predetermined electric power is supplied from an input terminal portion 14A, and the AC voltage is temporarily rectified by the converter 32 and is controlled to be converted to a constant value based on a predetermined stable DC voltage $V_{DC}$. By inputting the voltage converted into the direct current by the converter 32 to the inverters 33a to 33f, it is distributed to a plurality of high frequency AC voltages as outputs of the inverters 33a to 33f, and the waveforms of the high frequency AC voltages are shaped by the reactors 34a to 34f provided at the output portions of the inverters 33a to 33f. Thereby, six high frequency AC voltages satisfying predetermined electric energy are output from the electricity output terminals 65a to 65f toward the electricity input terminals 45a to 45f of the gas generator units 4a to 4f. Note that in the following description, when the inverters 33a to 33f are referred to individually or collectively, they are simply referred to as an "inverter 33".

In accordance with an instruction from the CPU board 37, a gate control circuit 32G boosts the output voltage of the converter 32 to a predetermined DC voltage $V_{DC}$ and at the same time, in order to stably control the DC voltage $V_{DC}$ to a constant value, the power element in the converter 32 is on/off controlled.

The current detectors 35a to 35f detect the DC current (current value) $I_{DC}$ to be supplied to each of the inverters 33a to 33f to which a constant value DC voltage $V_{DC}$ obtained from the converter 32 is input. The detected current $I_{DC}$ is taken into the CPU board 37 as electric power ($=V_{DC} \times I_{DC}$) supplied to each inverter 33. In order that desired electric power can be supplied to the inverters 33a to 33f in the CPU board 37, a control signal is given from the CPU board 37 to each of the inverters 33a to 33f via the inverter control circuit 33G such that the DC current $I_{DC}$ from the current detectors 35a to 35f takes values independent from each other in the inverters 33a to 33f, and independent feedback control is performed on each of the inverters 33a to 33f. As a result, since electric power having independent electric energy is supplied to each of the inverters 33a to 33f, the inverters 33a to 33f can output high frequency AC voltages which are independent of each other and satisfy the desired electric energy.

As described above, the multiple AC power supply section 3001 outputs six desired AC high frequency voltages corresponding to the gas generator units 4a to 4f, and the gas control section 3003 has a function of dividing the raw material gas into a plurality of gas flow rates to supply to the gas generator units 4a to 4f, and also adjusting the concentration of the generated output gas and the gas pressure in the gas generator 43 of each gas generator unit 4.

As described above, the display/operation panel 31 and the CPU board 37 constitute the control/operation section constituting section 3002.

The display/operation panel 31 is a display/operation panel installed on the front surface of the power supply/gas control unit 3. According to the conditions set with use of the display/operation panel 31, a control signal indicating an effective electric energy ($=V_{DC} \times I_{DC}$) of a plurality of high frequency AC voltages supplied from the multiple AC power supply section 3001 is output to the gate control circuit 32G and the inverter control circuit 33G of the multiple AC power supply section 3001. Then, the output voltage of the converter 32 is controlled to a constant voltage value $V_{DC}$ by the gate control circuit 32G, and the DC currents $I_{DC}$ supplied by the current detectors 35a to 35f are detected. The detected DC current value is feedback controlled to become a current value satisfying the desired electric energy. Thereby, a plurality of high frequency AC voltages are output from the inverters 33a to 33f. Therefore, by the control/operation section constituting section 3002, the electric energy to be supplied to the inverters 33a to 33f is set, and a plurality of high frequency AC voltages having a voltage value determined by the set electric energy are output from the electricity output terminals 65a to 65f.

The control/operation section constituting section 3002 adds control signals (gas flow rate setting signal and gas pressure setting signal) from the CPU board 37 to the MFCs 38a to 38f and the APCs 301a to 301f of the gas control section 3003, to thereby control the raw material gas flow rate (for the gas generator units 4a to 4f) in the gas control section 3003 and the internal pressure inside the gas generator 43. At that time, the content of control by the CPU board 37 is determined by the setting signal received from the display/operation panel 31.

As a result, in the gas control section 3003, the MFCs 38a to 38f control the flow rate of the raw material gas to be supplied to the gas generator units 4a to 4f based on the corresponding gas flow rate setting signals, respectively, and the APCs 301a to 301f controls, at a constant value, the upstream pressure of the corresponding gas generator 43 (pressure of the output gas on the output side of the gas generator 43) such that the internal pressure of the gas generator 43 in the gas generator units 4a to 4f becomes a predetermined pressure P, based on the corresponding gas pressure setting signals, respectively.

As described above, the MFCs 38a to 38f are provided corresponding to the gas generator units 4a to 4f, and each control the raw material flow rate which is a flow rate of the raw material gas to be input to the corresponding gas generator unit 4. The APCs 301a to 301f are provided corresponding to the gas generator units 4a to 4f, and each automatically control the internal pressure which is a pressure inside the gas generator 43 of the corresponding gas generator unit 4.

In this way, the gas control operation by the gas control section 3003 is executed under the control of the CPU board 37 that receives the setting signal from the display/operation panel 31, that is, under the control of the control/operation section constituting section 3002.

Further, the CPU board 37 displays the operating state of the entire gas generation apparatus 1 on the display/operation panel 31 on the front surface, based on the detected gas flow rate, the detected pressure, and the detected concentration detected by the MFCs 38a to 38f, the APCs 301a to 301f, and the gas densitometers 39a to 39f.

Further, the control/operation section constituting section 3002 sets the electric energy to be supplied to each of the inverters 33a to 33f in the multiple AC power supply section 3001, and performs, on the multiple AC power supply section 3001, AC power control operation to output a plurality of high frequency AC voltages (a plurality of AC voltages), a voltage value of each of which is determined by the set electric energy. This point will be described in detail below.

The control/operation section constituting section 3002 obtains optimum electric energy of the AC power supply of the gas generator 43 in the corresponding gas generator unit 4 among the gas generator units 4a to 4f such that a target concentration can be achieved, based on the detected gas flow rate detected by the corresponding MFC among the MFCs 38a to 38f, the detected pressure detected by the corresponding APC among the APCs 301a to 301f, and the detected concentration detected by the corresponding gas densitometer among the gas densitometers 39a to 39f. Then, the control/operation section constituting section 3002 sets a direct current set value I0 that satisfies the obtained electric energy so that the direct current $I_{DC}$ detected by the current detectors 35a to 35f becomes the direct current set value J0. Thereby, the control/operation section constituting section 3002 performs AC power control operation to output a high frequency AC voltage (AC voltage).

As described above, the AC power control operation is a control operation of obtaining an optimum value of the electric energy supplied to the corresponding inverter 33 among the inverters 33a to 33f, and outputting an AC voltage satisfying the electric energy of the optimum value from the inverter 33, based on the detected gas flow rate detected by the corresponding MFC 38 and the detected pressure detected by the corresponding APC 301, in addition to the detected concentration detected by the corresponding gas densitometer 39, regarding the high frequency AC voltages supplied to the gas generator units 4a to 4f.

As described above, the control/operation section constituting section 3002 functioning as an AC power supply control section gives control signals to the gate control circuit 32G and the inverter control circuit 33G, and performs AC power control operation on the multiple AC power supply section 3001. As a result, feedback control is performed on the inverters 33a to 33f so that the electric energy supplied to the gas generator 43 of the corresponding gas generator unit 4, among the gas generator units 4a to 4f, becomes the desired electric energy. Accordingly, a desired high frequency AC voltage can be output from each inverter 33. That is, regarding the high frequency AC voltages supplied from the control/operation section constituting section 3002, the AC power control operation is an operation of controlling the electric energy of the corresponding high frequency AC voltage based on at least the detected concentration detected by the corresponding gas densitometer 39.

The control/operation section constituting section 3002 in the gas generation apparatus 1 of the first embodiment performs the above-described AC power control operation, whereby it is possible to supply, to the corresponding gas generator unit 4 among the gas generator units 4a to 4f, a high frequency AC voltage having a voltage value that satisfies electric energy suitable for the gas flow rate of the raw material gas, the internal pressure inside the gas generator 43, and the set gas concentration of the output gas.

In this way, the control/operation section constituting section 3002 performs the AC power control operation on the multiple AC power supply section 3001, based on the detected gas flow rate detected by the corresponding MFC 38 among the MFCs 38a to 38f and the detected pressure detected by the corresponding APC 301 among the APCs 301a to 301f in addition to the detected concentration detected by the corresponding gas densitometer 39 among the gas densitometers 39a to 39f. As a result, a high frequency AC voltage is output from the multiple AC power supply section 3001 so that the electric energy supplied to the gas generator 43 in the corresponding gas generator unit 4 among the gas generator units 4a to 4f becomes a desired constant value.

As shown in FIG. 3, when the gas generation apparatus 1 of the first embodiment is viewed from the front, the power supply/gas control unit 3 is mounted on the upper part, and with use of the display/operation panel 31 provided on the front surface of the power supply/gas control unit 3, setting conditions and startup commands of the apparatus can be made for each gas generator unit 4. Control signals reflecting the setting conditions and the startup commands of the apparatus are transmitted from the CPU substrate 37 in the control/operation section constituting section 3002 to the multiple AC power supply section 3001 and the gas control section 3003.

As a result, in each gas generator unit 4, an AC voltage is applied to the gas generator 43 via the transformer 44, and a high-purity oxygen gas that is the raw material gas is supplied to each gas generator unit 4. Furthermore, an AC voltage is applied between the electrodes (discharge space portion) in the gas generator 43 of each gas generator unit 4, and dielectric barrier discharge (silent discharge) is generated between the electrodes. Thereby, the raw material gas supplied into the discharge space portion is converted into an ozone gas by the discharge phenomenon, and an ozone gas of high concentration and high purity can be taken out.

As shown in FIG. 4, when the gas generation apparatus 1 of the first embodiment is viewed from the back side, the electric wiring system, the supply system of the raw material gas to the respective gas generator units 4, and a gas output system for taking out the generated ozone gas are shown on the back side of the gas generation apparatus 1.

In FIG. 4, a single-phase or three-phase commercial AC voltage is received by the input terminal portion 14B from the external input terminal portion 14A, and is supplied from the input terminal portion 14B to the input terminal portion 14C of the power supply/gas control unit 3. Naturally, between the input terminal portion 14C of the power supply/gas control unit 3 and the input terminal portion 14B, an input breaker of the device, a conductor for controlling opening and closing of electricity and a noise cutting filter are mounted. However, they are omitted in FIG. 4 for convenience of explanation.

In the power supply/gas control unit 3, a commercial AC voltage is received from the outside (input terminal portion 14 A), is rectified by the converter 32 via the input terminal portions 14B and 14C (not shown in FIG. 1), and is converted into six high frequency AC voltages by the six inverters 33a to 33f. The six high frequency AC voltages are output to the electricity output terminals 65a to 65f of the power supply/gas control unit 3, and are transmitted to the electricity input terminals 45a to 45f of the gas generator units 4a to 4f electrically connected to the electricity output terminals 65a to 65f.

In addition, the supply system of the raw material gas and the gas output system will be described. High-purity oxygen gas that is a raw material gas is supplied from the raw material gas supply port 11A of the gas generation apparatus 1. The raw material gas is supplied from the raw material gas supply port 11A to the raw material gas supply port 11B of the power supply/gas control unit 3.

As shown in FIG. 1, to the gas control section 3003 between the raw material gas supply port 11B and the raw material gas piping port 11C, the MFCs 38a to 38f corresponding to the gas generator units 4a to 4f are provided. Therefore, the raw material gas is divided into a plurality of raw material gases via the MFCs 38a to 38f in the gas control section 3003 of the power supply/gas control unit 3, and the raw material gas is supplied from the raw material gas piping port 11C to each gas generator unit 4. As shown in FIG. 4, the raw material gas piping port 11C and the raw material supply ports 41a to 41f are connected by the piping route group 48. Thereby, the six raw material gases can be supplied to the gas generators 43 of the gas generator units 4a to 4f.

Each gas generator unit 4 has a water cooling function for cooling the discharge heat of the gas generator 43. The cooling water is supplied and discharged from each pipe 46. This allows the cooling water to circulate for cooling.

The gas generator units 4a to 4f supply high frequency AC voltages of predetermined electric power from the electricity input terminals 45a to 45f, and supply a raw material gas from the raw material gas piping port 11C. Then, the voltage is boosted to a high voltage by the transformer 44 in each gas generator unit 4, and the boosted voltage is applied to the gas generator 43. Then, dielectric barrier discharge is generated in the discharge space portion of the gas generator 43, and the raw material gas supplied into the discharge space portion is converted into an ozone gas of high concentration and high purity to generate an ozone gas. The generated ozone gas is output as output gas from the gas output ports 42a to 42f.

As the gas output ports 42a to 42f and the pipe 12A are connected to each other by the piping route group 49, six output gases (ozone gas) can be output from the gas generator 43 of the gas generator units 4a to 4f.

The output gas generated by the gas generator 43 of the gas generator units 4a to 4f is supplied from the gas output ports 42a to 42f to the pipe 12A of the power supply/gas control unit 3.

As shown in FIG. 1, since the gas control section 3003 between the pipe 12A and the pipe 12B is provided with the gas densitometers 39a to 39f and the APCs 301a to 301f, the output gas is output from the pipe 12B via the densitometers 39a to 39f and the APCs 301a to 301f in the gas control section 3003 of the power supply/gas control unit 3.

As shown in FIG. 4, the pipe 12B and the gas output piping port 12C are connected by a piping route group 50. The output gas is supplied from the gas output piping port 12C for the multi-gas treatment step in the six (a plurality of) semiconductor manufacturing process steps outside the gas generation apparatus 1, and the output gas is used with the gas concentration and the gas flow rate corresponding to each multi-gas treatment step.

The gas generation apparatus 1 has a configuration having a gas filter for removing impurities provided in the raw material gas supply section between the raw material gas supply ports 11A and 11B or between the raw material gas supply port 11B and the raw material gas piping port 11C, or having a gas filter between the pipe 12A and the pipe 12B, between the pipe 12B and the gas output piping port 12C, on the output side of the gas output piping port 12C, or the like. These constituent parts are not shown in FIG. 4 for convenience of explanation because they do not belong to the direct invention category.

As described above, in the gas generation apparatus 1 according to the first embodiment, with respect to the gas generator units 4a to 4f (a plurality of gas generator units), the multiple AC power supply section 3001, the gas control section 3003, and the control/operation section constituting section 3002 (AC power supply control section), each of which is in a single unit, are integrally formed. Accordingly, it is possible to mount six (a plurality of) gas generator units 4, for example, while making the whole apparatus compact.

Specifically, in the gas generation apparatus 1 of the first embodiment, with respect to the six gas generator units 4a to 4f (a plurality of ozone gas generator units) each having a gas generator (ozone generator) 43 that generates an ozone gas as an output gas generator, the multiple AC power supply section 3001, the gas control section 3003, and the control/operation section constituting section 3002, each of which is in a single unit, are integrally formed. Therefore, the gas generation apparatus 1 can be equipped with six gas generator units 4 each having a gas generator (ozone generator) 43, while making the whole apparatus compact.

As described above, the gas generation apparatus 1 according to the first embodiment integrates the six gas generator units 4a to 4f and the power supply/gas control unit 3. Thereby, from one gas generation apparatus 1, it is possible to output six independent output gases, enabling collective control of six output gases in a place where the installation area of the gas generation apparatus 1 is reduced.

In other words, the gas generation apparatus 1 is one unit of power supply/gas control unit 3, and a plurality of output gases having different gas flow rates and concentrations can be supplied from a plurality of gas generator units 4a to 4f according to the contents of the gas treatment step using the output gas. Thereby, quality control of the gas used in each gas treatment step can be carried out.

In addition, as the gas generator units 4a to 4f and the power supply/gas control unit 3 are separately configured in the gas generation apparatus 1, there is a merit that each unit is lighter and the unit can be easily replaced for maintenance.

In addition, since each of the gas generator units 4a to 4f basically includes only the transformer 44 and the gas generator 43, maintenance such as replacement of the gas generator 43 is also facilitated. Further, since a plurality of gas generator units 4a to 4f are mounted, even if a failure occurs in some of the gas generator units 4, an output gas can be supplied by another gas generator unit 4 that operates normally. Thereby, high reliability of gas supply can also be maintained.

Second Embodiment

Figure 5:
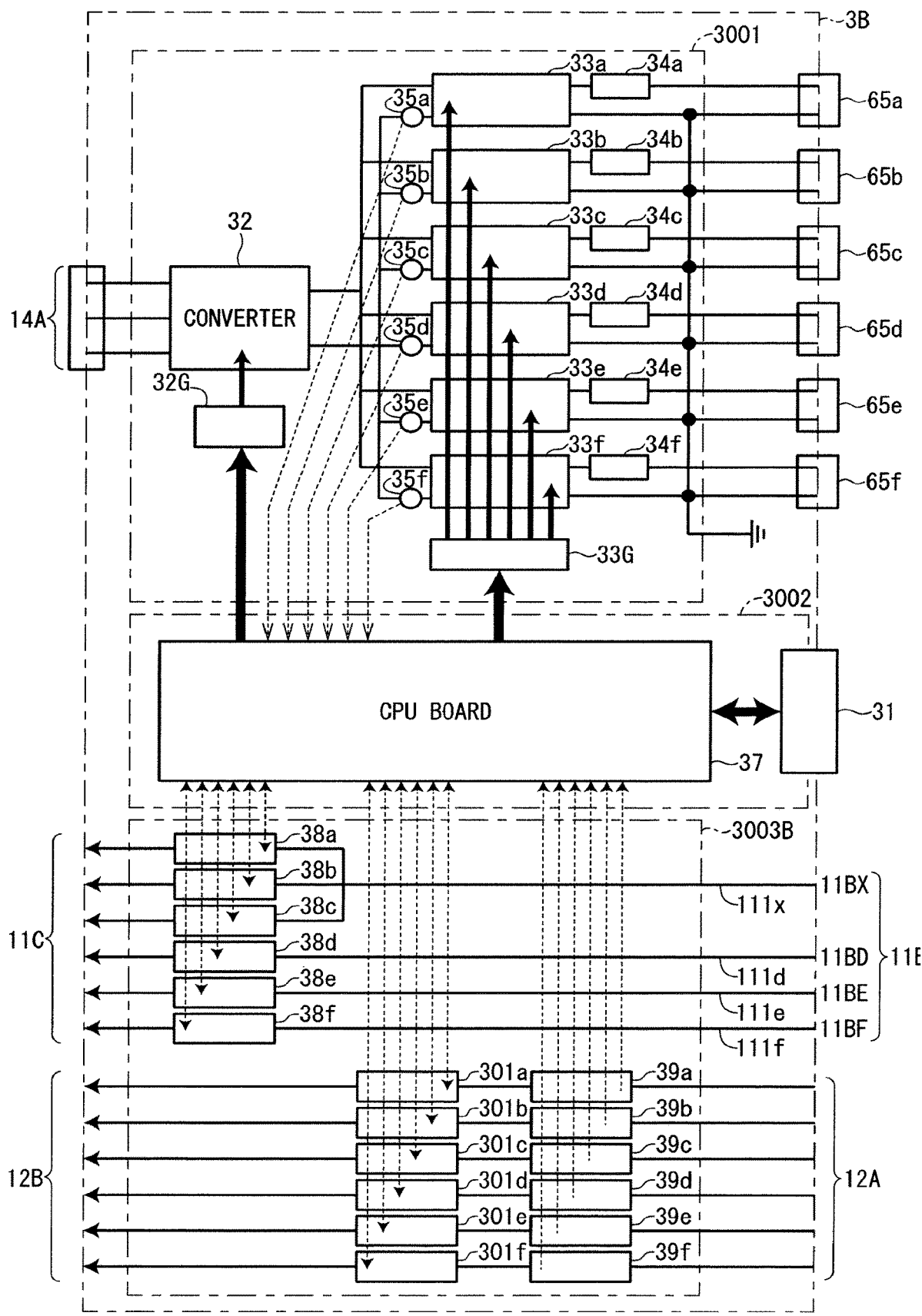
FIG. 5 is an explanatory diagram schematically showing an internal configuration of a power supply/gas control unit of a gas generation apparatus according to a second embodiment of the present invention.
Figure 6:
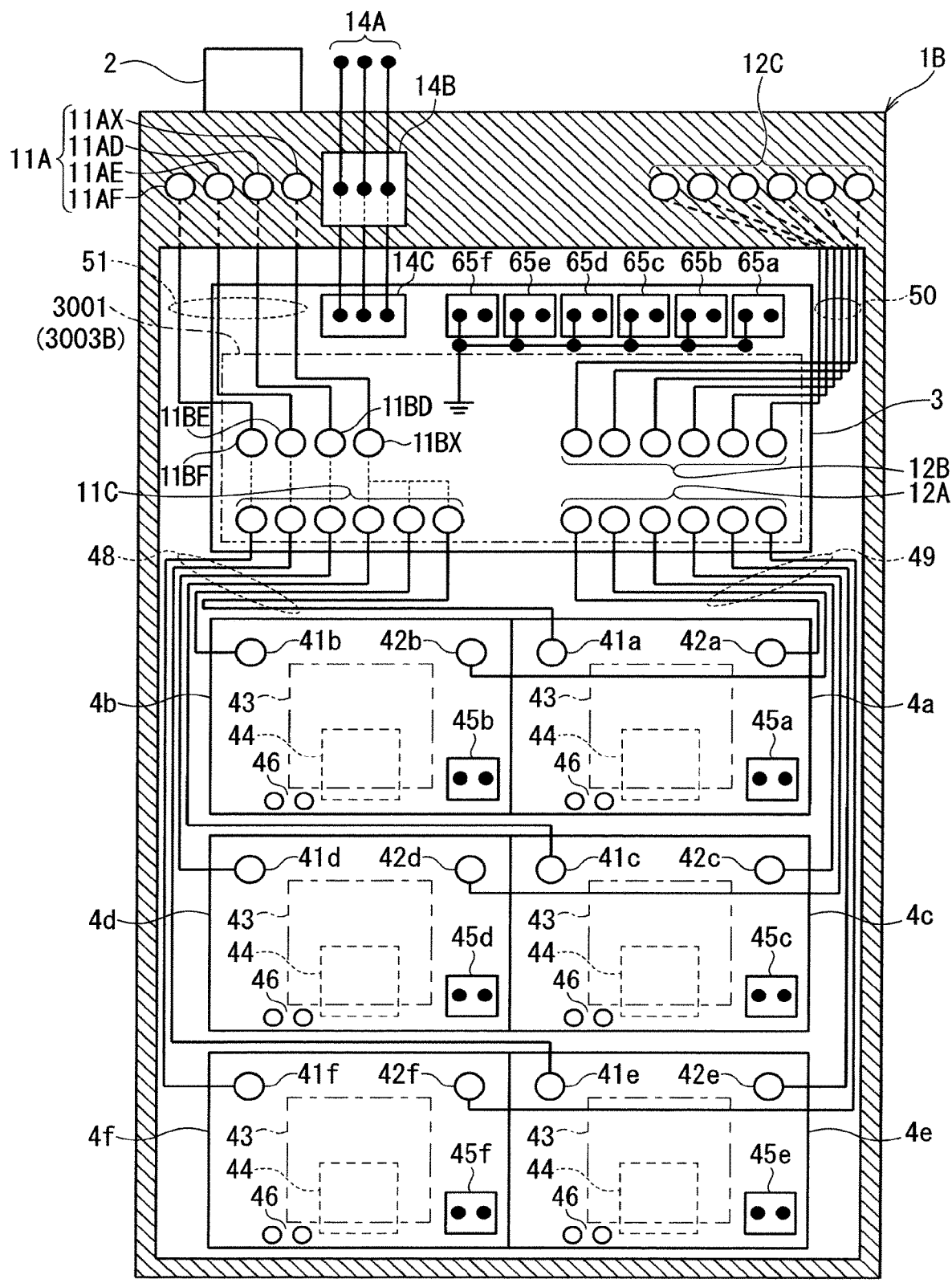
FIG. 6 is an explanatory diagram showing an outline of an exemplary arrangement of respective constituent parts and pipes viewed from the back side of the gas generation apparatus of the second embodiment.

A gas generation apparatus 1B according to a second embodiment of the present invention will be described with reference to FIGS. 5 and 6. FIG. 5 is an explanatory diagram schematically showing the internal configuration of a power supply/gas control unit of the gas generation apparatus according to the second embodiment of the present invention. FIG. 6 is an explanatory diagram showing an outline of an exemplary arrangement of respective constituent parts and pipes, viewed from the back side of the gas generation apparatus of the second embodiment.

In the following, with regard to the second embodiment, in view of the fact that the basic inventive concept is the same as that of the first embodiment, description will be given focusing on points different from the first embodiment. The same constituent parts as those in the first embodiment will be denoted by the same reference numerals and the explanation thereof is omitted appropriately.

The gas generation apparatus 1 of the first embodiment has a configuration in which one kind of raw material gas is supplied as a raw material gas. However, as the gas generation apparatus 1B of the second embodiment, a plurality of kinds of raw material gases are supplied independently, whereby a plurality of generated gases from the gas generation apparatus 1B, required for semiconductor manufacturing process steps and other processing applications in various semiconductor manufacturing apparatuses, can be used.

As shown in FIGS. 5 and 6, the gas generation apparatus 1B of the second embodiment supply four kinds of raw material gases (first gas to fourth gas) as raw material gases, and includes a power supply/gas control unit 3B and gas generator units 4a to 4f that output six output gases.

As shown in these figures, similarly to the gas generation apparatus 1 of the first embodiment, in one gas generation apparatus 1B, gas generator units 4a to 4f that are multi-chamber generator units capable of generating a plurality of discharge phenomena are mounted. Similarly to the gas generation apparatus 1 of the first embodiment, the gas generation apparatus 1B is provided with the multiple AC power supply section 3001 that outputs a plurality of high frequency AC voltages to the gas generator units 4a to 4f.

On the other hand, in the gas control section 3003B, the raw material gas supply port 11B is configured of four mutually independent raw material gas supply ports 11BX, 11BD, 11BE and 11BF. The raw material gas supply port 11BX is connected to the MFCs 38a to 38c via a pipe 111x. On the other hand, the raw material gas supply ports 11BD to 11BF are connected to the MFCs 38d to 38f via pipes 111d to 111f in a one-to-one relationship.

That is, by the gas control section 3003B, a first gas that is a raw material gas supplied from the raw material gas supply port 11BX is distributed by the MFCs 38a to 38c for the raw material of three systems, and then supplied as raw material gases of the gas generators 43 of the gas generator units 4a to 4c.

Further, by the gas control section 3003B, a second gas, a third gas, and a fourth gas that are three different kinds of raw material gases supplied from the raw material gas supply ports 11BD to 11BF are supplied as raw material gases of the gas generators 43 of the gas generator units 4d to 4f via the MFCs 38d to 38f.

As described above, the gas control section 3003B has a raw material gas passage including the pipe 111x, the pipe 111d, the pipe 111e, and the pipe 111f that are disposed so as to supply the four types of raw material gases (a plurality of types of raw material gases) to the corresponding gas generator units 4 among the gas generator units 4a to 4f, respectively.

Therefore, the gas control section 3003B differs from the gas control section 3003 of the first embodiment in a point that it is configured that four kinds of raw material gases (a plurality of kinds of raw material gases) classified as the first gas to the fourth gas are supplied to the six gas generator units 4a to 4f.

Similarly to the gas control section 3003 of the first embodiment, in the gas control section 3003B, APCs 301a to 301f for automatically controlling the gas pressure for generation by the gas generator 43 of the gas generator units 4a to 4f to a predetermined pressure P, and gas densitometers 39a to 39f for detecting a gas concentration value of the output gas generated from the gas generator 43 of the gas generator units 4a to 4f as a detected concentration, are provided between the pipes 12A and 12B.

As described above, the power supply/gas control unit 3B in the gas generation apparatus 1B according to the second embodiment includes the gas control section 3003B having the configuration described above, and the multiple AC power supply section 3001 and the control/operation section constituting section 3002 having the same configurations as those of the first embodiment.

As shown in FIGS. 5 and 6, four raw material gas supply ports 11AX, 11AD, 11AE, and 11AF which are independent from each other are provided as the raw material gas supply port 11A constituting the gas flow path of the raw material gas to be supplied. The raw material gas supply ports 11AX and 11AD to 11AF and the raw material gas supply ports 11BX and 11BD to 11BF are connected to each other via a piping route group 51 in a one-to-one relationship.

Similarly to the first embodiment, between the raw material gas supply ports 11AX and 11BX, a high-purity oxygen gas is used as the raw material gas (first gas), and as shown in FIGS. 5 and 6, in the gas control section 3003B, the raw material gas is distributed to three gas flow paths and are supplied to the gas generators 43 of the gas generator units 4a to 4c. By outputting the high purity ozone gases from the gas generators 43 of the respective gas generator units 4a to 4c, the ozone gases having different generated gas flow rates and concentrations can be output and used in the external multi-gas treatment step. Therefore, regarding the gas generator units 4a to 4c, similarly to the gas generator units 4a to 4f of the first embodiment, the first gas is supplied to the corresponding gas generator 43, and the ozone gas generated by the gas generator 43 is output from the gas output piping port 12C as an output gas.

Between the raw material gas supply ports 11AD and 11BD and between the raw material gas supply ports 11AE and 11BE, a high purity oxygen gas (first partial raw material gas) is used as a base, and a mixed raw material gas in which a slight amount of a second partial raw material gas is mixed with the high purity oxygen gas is used as the second gas for the gas generator 43 of the gas generator unit 4d and the third gas for the gas generator 43 of the gas generator unit 4e.

As the second partial raw material gas, at least one of a carbon-based ($CO_2$ gas, CO gas, ethane $C_2H_6$, propane $C_3H_8$, $CF_4$, etc.) gas, a hydrogen-based ($H_2$, HF, HCL, HBr, $H_2S$, etc.) gas, a nitrogen-based ($N_2$, $NO_2$, $N_2O$, $NH_3$, etc.) gas, and a fluorine-based ($F_2$, $SF_6$, $C_3F_8$, etc.) gas may be considered.

Then, by supplying the second gas and the third gas, which are the aforementioned mixed raw material gases different from the high purity oxygen gas, to the gas generators 43 of the gas generator units 4d and 4e, it is possible to use a special generated gas as an output gas with use of the discharge phenomenon by the gas generator 43 of the gas generator units 4d and 4e. Thereby, the output gas can be used for a gas treatment step in a semiconductor manufacturing apparatus outside the gas generation apparatus 1. Note that examples of the special generated gas include ozone (oxygen-based)/carbon compound-based generated gas, ozone (oxygen-based)/hydrogen compound-based generated gas, ozone (oxygen-based)/nitrogen compound-based generated gas, ozone (oxygen-based)/fluorine compound-based generated gas, and the like.

As described above, the mixed raw material gas obtained by adding a slight amount of carbon-based gas, hydrogen-based gas, nitrogen-based gas, or fluorine-based gas (second partial raw material gas) of about 10% or less to the gas based on oxygen (first partial raw material gas) is supplied as the second gas and the third gas to the gas generators 43 of the gas generator units 4d and 4e, and a high frequency AC voltage is applied, whereby a dielectric barrier discharge phenomenon in the gas generator 43 is generated.

As a result, from the gas generators 43 of the respective gas generator units 4d and 4e, it is possible to output a special generated gas containing at least one oxide compound gas by a discharge chemical reaction, among a carbon compound-based generated gas, a hydrogen compound-based generated gas, a nitrogen compound-based generated gas, and a fluorine compound-based generated gas generated by a discharge chemical reaction between a slight amount of added carbon, hydrogen, nitrogen, fluorine-based gas and oxygen gas, in addition to generation of the ozone gas.

Therefore, in the external semiconductor manufacturing apparatus, when a special generated gas (oxide compound gas) obtained by the discharge chemical reaction is supplied to a gas treatment chamber in a negative pressure state used in a semiconductor manufacturing process, and the ambient temperature of the gas treatment chamber is increased to several hundred degrees or the like, a part of the supplied ozone gas undergoes a decomposition reaction to a very active oxygen atom radical, and chemical reaction between the oxygen atom radical and the carbon compound-based generated gas, the hydrogen compound-based generated gas, the nitrogen compound-based generated gas, and the fluorine compound-based generated gas is promoted. Thereby, a special semiconductor processing step corresponding to the type of the gas can be performed on the semiconductor wafer surface mounted on the gas treatment chamber. Therefore, the gas treatment quality on the semiconductor wafer surface is enhanced, and also the gas treatment efficiency is enhanced.

For example, as a treatment of a semiconductor wafer surface mounted on a gas treatment chamber by the generated oxygen gas and the carbon compound-based generated gas, "C1-Chemistry" reaction can be realized on the semiconductor wafer surface, and a special thin film containing carbon can be formed on the semiconductor wafer surface. Therefore, there is a possibility that it can be used for semiconductors having special properties. Note that C1 chemistry is a technique for bonding between an atom having a carbon number of 1 of a compound gas such as carbon and a substance or synthesizing an oxide compound having a carbon number of 2 or larger.

Further, as a surface treatment of a semiconductor wafer mounted on the gas treatment chamber, which is carried out using the above-described "C1 chemistry" reaction or oxygen gas and hydrogen compound-based generated gas on the semiconductor wafer surface by the generated oxygen gas and the hydrogen compound-based generated gas, the "C1 chemistry" reaction and OH radical on the semiconductor wafer surface can be realized on the semiconductor wafer surface. Therefore, there is a possibility that it can be used for dry cleaning treatment on the semiconductor wafer surface.

As a surface treatment of the semiconductor wafer mounted on the gas treatment chamber by the generated oxygen gas and the nitrogen compound-based generated gas, it is possible to facilitate chemical reaction of nitrogen number 1 utilizing the heat dissociation reaction heat of the ozone gas on the semiconductor wafer surface. Therefore, it is possible to form a special nitride material thin film on the semiconductor wafer surface, and there is a possibility that it can be used for insulating thin film formation processing on the semiconductor wafer surface.

As a surface treatment of the semiconductor wafer mounted on the gas treatment chamber by the generated oxygen gas and the fluorine compound type generated gas, it is possible to promote chemical reaction of the fluorine radical using the heat dissociation reaction heat of the ozone gas on the semiconductor wafer surface. Fluorine radicals have a property of corroding substances very much, and there is a possibility that fluorine radicals can be used for etching processing of a semiconductor wafer surface and a resist stripping treatment making use of this corrosion effect.

As described above, in the gas generation apparatus 1B of the second embodiment, the gas generator 43 of the gas generator units 4d and 4e is supplied with a mixed raw material gas (second gas, third gas) to which a slight amount of another gas based on oxygen gas is added, and the gas generator 43 outputs another oxygen compound discharge gas including an ozone gas, so that it can be used in various processing steps on the semiconductor wafer surface. It is used as a gas for improving processing efficiency such as use for semiconductors having semiconductor wafer surfaces of special properties, quality improvement, and reduction of processing time.

Further, between the raw material gas supply ports 11AF and 11BF, the used ozone gas is supplied as a raw material gas (fourth gas). Then, the gas generator 43 of the gas generator unit 4f is used as one that processes an ozone gas that is applied with ozone decomposition to the ozone gas of low concentration by using discharge phenomenon to ozone gas. That is, an inverse application method in which the gas generator 43 of the gas generator unit 4f is used as the gas generator 43 for gas-decomposition by discharge is also possible.

In this way, when the exhaust gas used in the various treatment steps of a semiconductor is temporarily returned to the gas generator 43 of the gas generator unit 4f and supplied as a raw material gas of the gas generator 43, and the exhaust gas of various kinds of compound gases including exhaust ozone is supplied and the exhaust gas is gas-decomposed and exhausted by discharging, it is possible to achieve an effect of reducing the load of the exhaust gas treatment apparatus that is used conventionally.

In the case where the gas generator unit 4f is used exclusively as an ozone decomposing apparatus for exhaust gas treatment which decomposes exhaust gas of various compound gases including exhaust ozone as described above, the MFC 38f and the gas densitometer 39f shown in FIG. 5 may be omitted.

As described above, the gas generation apparatus 1B according to the second embodiment can supply a plurality of types of output gases obtained by converting a plurality of types of raw material gases in one unit configuration, so that it can handle various gas treatment steps.

For example, from one gas generation apparatus 1B, by adopting a mixed raw material gas in which a second partial raw material gas which is at least one of a carbon-based gas, a hydrogen-based gas, a nitrogen-based gas, and a fluorine-based gas, is added to the oxygen gas that is a first partial raw material gas, as the second gas and the third gas for the gas generator units 4d and 4e, various gas treatment steps can be handled.

As described above, the gas generation apparatus 1B according to the second embodiment can supply different kinds of generated gases, whereby a plurality of different types of generated gases can be made as output gases from a plurality of types of raw material gases. As a result, the gas generation apparatus 1B according to the second embodiment enables various output gases to be provided. Accordingly, various processes in the semiconductor manufacturing process, such as dry cleaning, etching, resist stripping treatment, and insulating thin film treatment, using output gases, can be collectively managed by one gas generation apparatus 1B, which provides an advantage that it can be used for a more efficient semiconductor manufacturing process.

Third Embodiment

Figure 7:
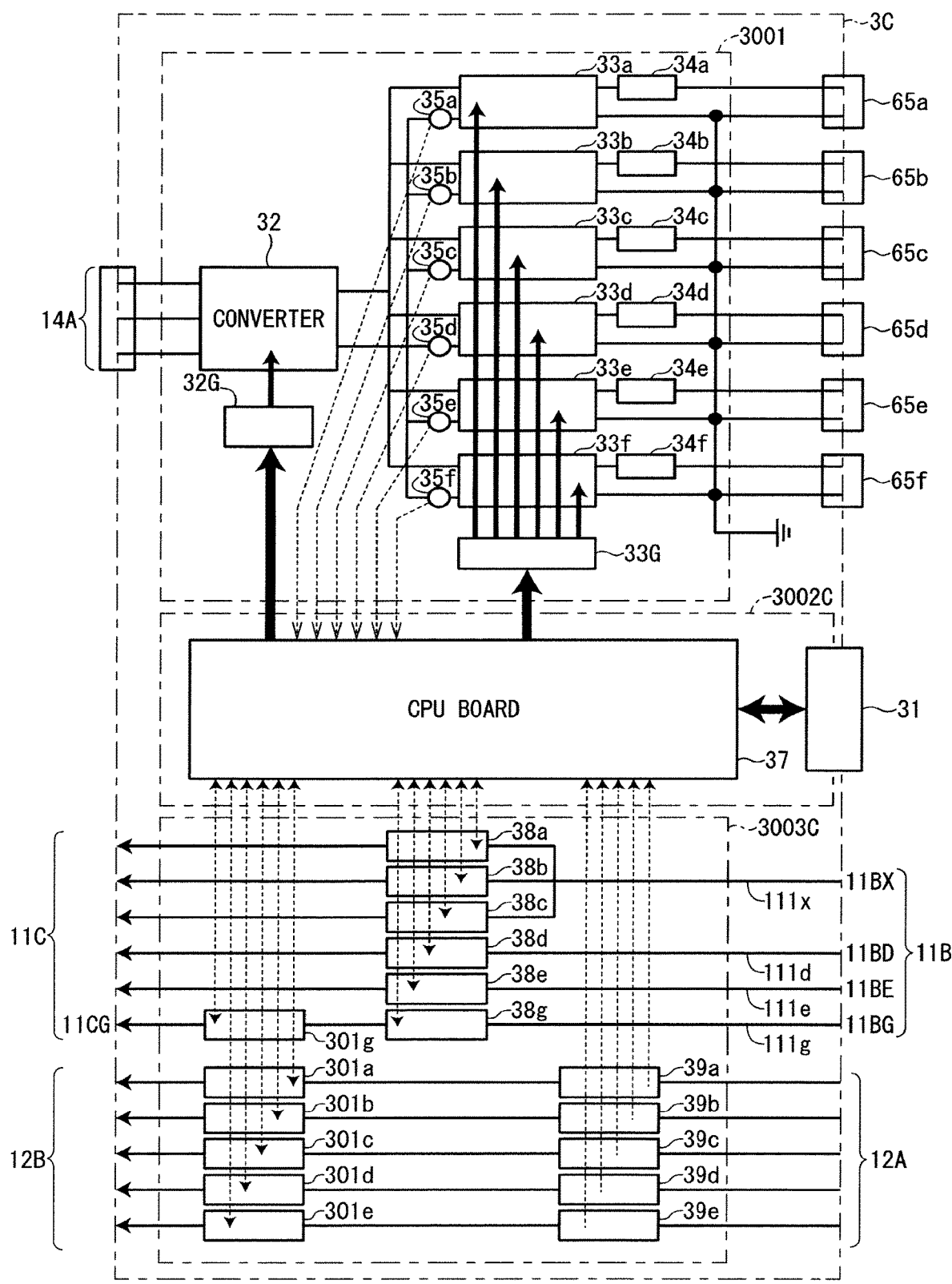
FIG. 7 is an explanatory diagram schematically showing an internal configuration of a power supply/gas control unit of a gas generation apparatus according to a third embodiment of the present invention.
Figure 8:
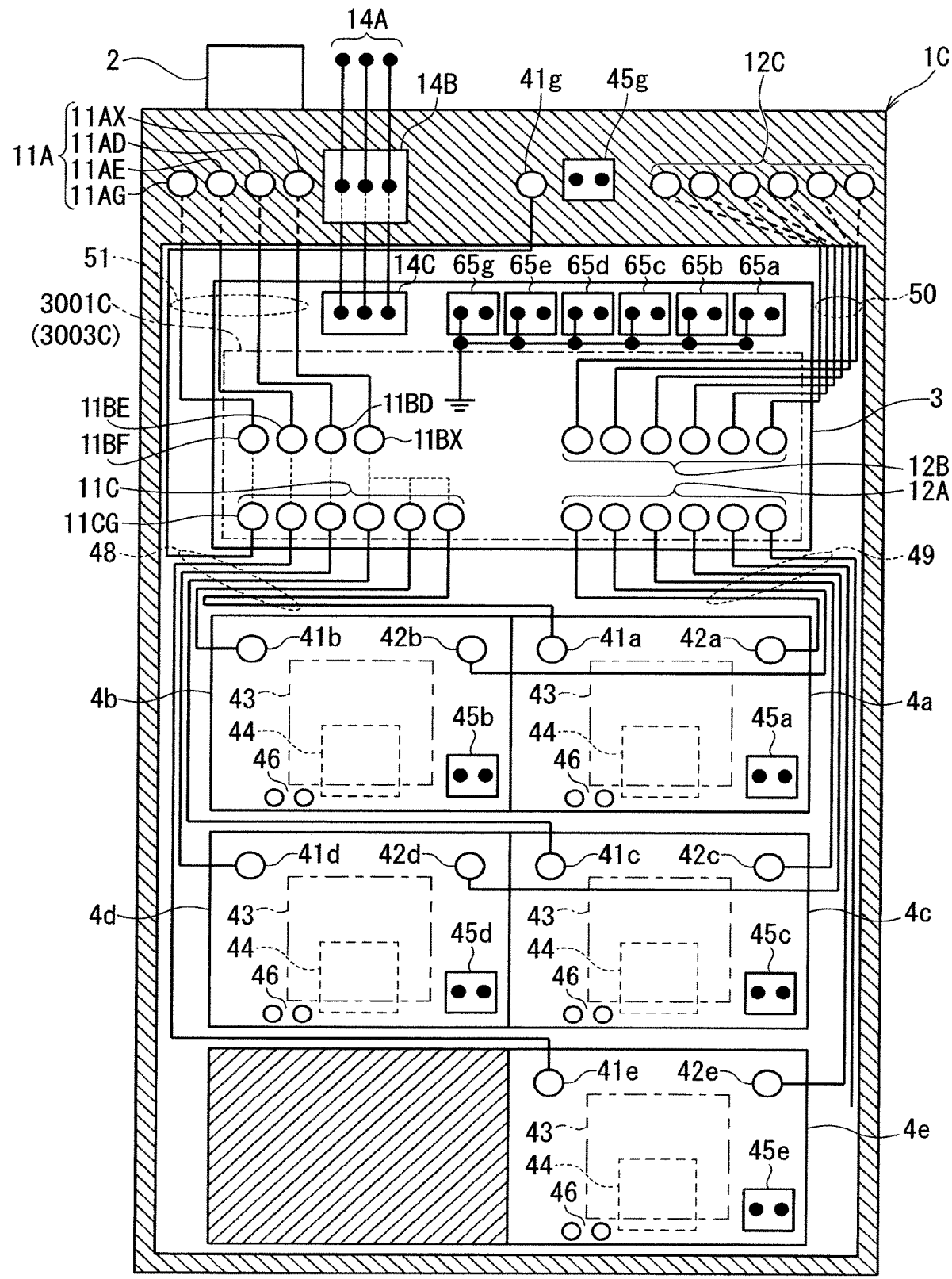
FIG. 8 is an explanatory diagram showing an outline of an exemplary arrangement of respective constituent parts and pipes viewed from the back side of the gas generation apparatus of the third embodiment.

A gas generation apparatus 1C according to a third embodiment of the present invention will be described with reference to FIGS. 7 and 8. FIG. 7 is an explanatory diagram schematically showing the internal configuration of a power supply/gas control unit of a gas generation apparatus according to the third embodiment of the present invention. FIG. 8 is an explanatory diagram showing an outline of an exemplary arrangement of respective constituent parts and pipes viewed from the back side of the gas generation apparatus of the third embodiment.

In the following, in view of the fact that the basic inventive concept is the same as that of the first embodiment and the second embodiment, with respect to the third embodiment, the points different from the first embodiment and the second embodiment will be mainly described. The same reference numerals are given to the same constituent parts as those of the first embodiment and the second embodiment, and the description thereof will be omitted as appropriate.

In the first embodiment and the second embodiment, the configuration in which the gas generator units 4a to 4f all exist in the gas generation apparatus 1 (1B) has been described. The gas generation apparatus 1C of the third embodiment is configured such that even if some of the gas generator units are present outside the gas generation apparatus 1C, the power supply/gas control unit 3 of the gas generation apparatus 1C can be used, and the output gas generated in the external gas generator unit can be used for various semiconductor manufacturing processing steps and other processing applications.

Hereinafter, description will be given on the premise that there is a gas generator unit 4g (external gas generator unit) disposed outside the gas generation apparatus 1C, which is not shown in FIGS. 7 and 8. The gas generation apparatus 1C of the third embodiment is provided such that a multiple AC power supply section 3001C and a gas control section 3003C can be connected to the gas generator unit 4g outside the gas generation apparatus 1C.

As shown in FIGS. 7 and 8, the gas generation apparatus 1C of the third embodiment includes a power supply/gas control unit 3C that supplies four types of raw material gases as raw material gases, divides them into six raw material gases by six MFCs 38a to 38e and 38g, supplies the raw material gases to the raw material gas piping port 11CG via one APC 301g, and outputs output gases to the pipe 12B via the five gas concentration detectors 39a to 39e and five APCs 301a to 301e. The gas generation apparatus 1C also includes the gas generator units 4a to 4e that output five output gases. The gas generator unit 4g can be installed outside the gas generation apparatus 1C, and the gas generator unit 4g can be controlled by the multiple AC power supply section 3001C and the gas control section 3003C. It is desirable that the internal configuration of the gas generator unit 4g, not shown, is the same as that of each of the gas generator units 4a to 4e.

In the third embodiment, the gas generator units 4a to 4e, which are multi-chamber generator units capable of generating a plurality of discharge phenomena, are mounted in one unit of gas generation apparatus 1C. The gas generation apparatus 1C is provided with the multiple AC power supply section 3001C for outputting a plurality of high frequency AC voltages to the gas generator units 4a to 4e and the gas generator unit 4g.

The gas control section 3003C has a raw material gas passage including a pipe 111x, a pipe 111d, and a pipe 111e which are provided so that three types of raw material gases are supplied to the corresponding gas generator units 4 of the gas generator units 4a to 4e, respectively.

Furthermore, the gas control section 3003C enables a part of the raw material gas to be output to the gas generator unit 4g, and also supplies the raw material gas to the gas generator 43 of the gas generator unit 4g. In addition, a part of the high frequency AC voltage of the multiple AC power supply section 3001C is allowed to be output to the external gas generator unit 4g, and the generated gas obtained by the discharge phenomenon in the gas generator 43 of the external gas generator unit 4g is allowed to be directly output to an external predetermined processing apparatus as an output gas.

As shown in FIGS. 7 and 8, the gas generation apparatus 1C of the third embodiment has a power supply/gas control unit 3C that supplies four types of raw material gases as raw material gases. The power supply/gas control unit 3C distributes and supplies a part of the raw material gas supplied from the raw material gas supply ports 11BX, 11BD, and 11BE to the gas generator units 4a to 4e in the gas generation apparatus 1C via the MFCs 38a to 38e. On the other hand, another part of the gas supplied from the raw material gas supply port 11BG is supplied to the external gas generator unit 4g via the MFC 38g and the APC 301g. In addition to the above-described power supply/gas control unit 3C, the gas generation apparatus 1C is equipped with gas generator units 4a to 4e for outputting five output gases.

As shown in FIGS. 7 and 8, the gas generation apparatus 1C of the third embodiment is a gas generation apparatus that receives four kinds of gases as raw material gases as in the second embodiment, and is equipped with multi-chamber generators configured of the gas generator units 4a to 4e.

As shown in FIGS. 7 and 8, the configuration between the raw material gas supply ports 11BX, 11BD and 11BE of the raw material gas supply port 11B on the input side and the raw material gas piping port 11C on the output side of the gas control section 3003C is common to that of the gas control section 3003B of the second embodiment. Therefore, the description thereof is omitted.

In the gas generation apparatus 1C according to the third embodiment, the gas generator unit 4f mounted in the first and second embodiments is eliminated, and instead the gas generator unit 4g is assumed to be provided outside the gas generation apparatus 1C.

Further, an external MFC 38g and an external APC 301g are interposed between the raw material gas supply port 11BG on the input side and the raw material gas piping port 11C of the gas control section 3003C via a pipe 111g.

In the gas generator unit 4g which supplies a hydrogen gas, a fluorine gas, a nitrogen gas, or ozone as a raw material gas (fourth gas) to be supplied to the raw material gas supply port 11BG and receives the supplied raw material gas (fourth gas), discharge is utilized, and the radical gas of the raw material gas is supplied as an output gas to an external semiconductor manufacturing apparatus or the like for use.

As shown in FIGS. 7 and 8, in the gas control section 3003C of the gas generation apparatus 1C of the third embodiment, the raw material gas supplied through the raw material gas supply port 11BG is made to have a predetermined flow rate by the external MFC 38g, and an external APC 301g for controlling the generator pressure in the raw material gas portion is provided on the input side (downstream side) of the gas generator 43, and the raw material gas through the external APC 301g is output via the piping port 11CG, from an external raw material supply port 41g provided at the upper part of the back side of the gas generation apparatus 1C so that the raw material gas can be supplied to the external gas generator unit 4g.

Here, the other APCs 301a to 301e control the pressure of the output gas, which is the upstream pressure of the gas, so that the internal pressure inside the gas generator 43 of the gas generator units 4a to 4e installed in the gas generation apparatus 1C is adjusted. However, the external APC 301g controls the pressure of the raw material gas, which is the downstream pressure of the gas, which is on input side of the gas generator 43 to thereby adjust the internal pressure inside the gas generator 43 of the gas generator unit 4g installed outside the gas generation apparatus 1C.

Further, an electricity output terminal 65g for supplying an external high frequency AC voltage (external AC voltage) to the outside is provided adjacent to electricity output terminals 65a to 65e at an upper portion of the back side of the power supply/gas control unit 3. Further, by supplying an external high frequency AC voltage to the gas generator unit 4g installed in the gas generation apparatus 1C from an external electricity input terminal 45g electrically connected to the electricity output terminal 65g and provided at an upper portion of the gas generation apparatus 1C outside the power supply/gas control unit 3, the gas generated from the external gas generator unit 4g can be directly used as an output gas.

At this time, the control/operation section constituting section 3002C performs AC power control operation, similarly to those of the first and second embodiments, on the gas generator units 4a to 4e, and also performs AC power control operation for controlling the quantity of electric current corresponding to the external high frequency AC voltage (external AC voltage) to be supplied to the external gas generator unit 4g.

The AC power control operation for the gas generator unit 4g is an operation of controlling the quantity of electric current corresponding to the external AC voltage on the basis of the external detected gas flow rate detected by the external MFC 38g and the external detected pressure detected by the external APC 301g. In this way, the control/operation section constituting section 3002C functioning as the AC power supply control unit performs the AC power control operation for the gas generator unit 4g in addition to the AC power control operation for the gas generator units 4a to 4e.

Since the gas generator unit 4g is not provided in the gas generation apparatus 1C and can be disposed at a place different from the gas generation apparatus 1C, the gas generator unit 4g can be installed in the vicinity of an external semiconductor processing chamber (semiconductor processing apparatus such as a semiconductor manufacturing apparatus) that is a destination of supplying the output gas obtained in the gas generator unit 4g, it has an advantage that it is possible to supply the output gas generated by the gas generator unit 4g with short piping.

Further, if an external semiconductor processing chamber and the gas generator unit 4g arranged close to each other are directly connected, a gas output port 42a of the gas generator unit 4g is formed into a nozzle shape, and the output gas generated by the gas generator unit 4g is ejected to a semiconductor processing chamber which has a negative pressure of about 100 Pa or less, the output gas passes through the nozzle, and the gas pressure rapidly decreases. As a result, the ejected output gas is accelerated to have a supersonic speed, and supplied to the wafer treatment surface set in the semiconductor processing chamber, which enables processing of the wafer treatment surface.

As described above, the advantages provided by the fact that the semiconductor processing chamber and the gas generator unit 4g can be directly connected with relatively short piping are that the generated gas can be output in a very short time, and that the output gas can be ejected to the wafer treatment surface at an ultrasonic gas speed. Thereby, the gas generated by the discharge is supplied to the wafer treatment surface in several tens of milliseconds or less. This point will be described in detail below.

In the first and second embodiments, it is assumed that the output gas obtained by the gas generator units 4a to 4f is a molecular gas, and that a relatively stable gas is supplied to the semiconductor processing chamber. In contrast to this premise, in the gas generation apparatus 1C of the third embodiment, since the semiconductor processing chamber and the gas generator unit 4g can be directly connected by relatively short pipes, the gas generated in the gas generator unit 4g can be supplied to the semiconductor processing chamber for processing in several tens of milliseconds or less. Therefore, even when the output gas generated in the gas generator unit 4g has a very short lifetime, it can be supplied to the semiconductor processing chamber, and processing of the wafer treatment surface with the radical gas generated by the discharge becomes possible. Therefore, the processing quality improves, and an effect that processing can be performed at high speed is also achieved.

For example, it is possible to supply an ozone gas and an oxygen gas as raw material gases to the gas generator 43 of the gas generator unit 4g, and eject the output gas (oxygen radical gas) obtained by the gas generator 43 of the gas generator unit 4g to the wafer surface in the semiconductor processing chamber via a gas ejecting nozzle. In this case, the decomposition reaction to return to oxygen molecules is reduced by the distance from the nozzle opening of the semiconductor processing chamber to the wafer surface and the atmospheric gas temperature, the oxygen radical gas of high concentration can reach the wafer surface, high-concentration oxygen radical gas treatment becomes possible, and high-concentration oxygen radical gas treatment can be performed even in a higher temperature state as compared with conventional oxidation treatment, so that formation of an oxide insulating thin film with better quality can be realized.

Further, when a hydrogen gas is supplied as a raw material gas to the gas generator unit 4g installed outside, and the output gas (hydrogen radical gas) obtained by the gas generator unit 4g is ejected to the wafer surface in the semiconductor processing chamber via a gas ejecting nozzle, it is possible to perform hydrogen radical gas treatment, and to perform hydrogen reduction reaction treatment with hydrogen radical gas. Thereby, cleaning processing on the wafer surface can be performed with higher quality.

Further, by supplying a nitrogen radical gas as the output gas from the gas generator unit 4g to the wafer surface in the semiconductor processing chamber, it is possible to form a high-quality nitride thin film and form a high quality thin film. In addition, when a fluorine radical gas is supplied as an output gas from the gas generator unit 4g to the wafer surface in the semiconductor processing chamber, etching processing and resist peeling of the wafer surface can be performed at high speed.

As described above, the gas generation apparatus 1C of the third embodiment supplies a raw material gas to the external gas generator unit 4g and manages the pressure of the gas generator 43 in the gas generator unit 4g, and also is able to apply an external high frequency AC voltage to the gas generator 43 in the gas generator unit 4g.

Thus, in the gas generation apparatus 1C of the third embodiment, the gas generator unit 4g, which is an external gas generator unit, is directly connected to the semiconductor processing chamber to generate a radical gas, and the generated gas is directly supplied to the semiconductor processing chamber. Therefore, various radical gases can be supplied, providing a merit of improving the quality of semiconductor manufacturing.

As described above, since the gas generation apparatus 1C according to the third embodiment can control the gas generator unit 4g which is an external output gas generation unit which can be disposed discretely from the gas generation apparatus 1C, it is possible to improve convenience with an external semiconductor manufacturing apparatus such as disposing the gas generator unit 4g near the external semiconductor manufacturing apparatus (semiconductor processing chamber) that uses the output gas.

\<Others\>

Although the present invention has been particularly described with reference to a gas generation apparatus for generating an output gas to be used in a semiconductor manufacturing process, it is an example of a business model invention of the above-described gas generation apparatus in all aspects, and the present invention is not limited thereto. It is understood that innumerable modifications not illustrated can be envisaged without departing from the scope of the present invention.

For example, it is conceivable that the gas generator unit 4f is replaced with the gas generator unit 4g of the third embodiment in the configuration of the first embodiment.

Although the present invention has been described in detail, the above description is illustrative in all aspects, and the present invention is not limited thereto. It is understood that innumerable modifications not illustrated can be envisaged without departing from the scope of the present invention.

The invention claimed is:

1. A gas generation apparatus having a plurality of gas generator units each including a gas generator that generates an output gas, comprising:
    a multiple AC power supply section that is shared by said plurality of gas generator units and supplies a plurality of AC voltages to said plurality of gas generator units; and
    a gas control section that is shared by said plurality of gas generator units and controls a raw material gas supplied to said plurality of gas generator units and the output gas generated by said plurality of gas generator units, wherein
    said gas control section includes:
        a plurality of mass flow controllers (MFCs) provided corresponding to said plurality of gas generator units, each of the plurality of the MFCs controlling a raw material gas flow rate that is a flow rate of the raw material gas being input to a corresponding one of the plurality of the gas generator units;
        a plurality of auto pressure controllers (APCs) provided corresponding to said plurality of gas generator units, each of the plurality of APCs controlling an internal pressure that is a pressure inside the gas generator of a corresponding one of the plurality of the gas generator units; and
        a plurality of gas densitometers provided corresponding to said plurality of gas generator units, each of the plurality of gas densitometers detecting a concentration of the output gas output by the gas generator of a corresponding one of the plurality of the gas generator units as a detected concentration,
    said gas generation apparatus further comprises
        an AC power supply control section that performs an AC power control operation on said multiple AC power supply section,
    said AC power control operation includes an operation of controlling electric energy of a corresponding AC voltage of said plurality of AC voltages, based on the detected concentration detected by a corresponding one of the plurality of gas densitometers, and
    said plurality of gas generator units, said multiple AC power supply section, said gas control section, and said AC power supply control section are integrally provided.

2. The gas generation apparatus according to claim 1, wherein
    each of said plurality of MFCs detects the raw material gas flow rate as a detected gas flow rate, and each of said plurality of APCs detects a pressure on an output side of a corresponding one of the plurality of the gas generator units as a detected pressure, and
    said AC power control operation controls electric energy of a corresponding AC voltage, based on a detected gas flow rate detected by a corresponding one of the plurality of the MFCs and a detected pressure detected by a corresponding one of the plurality of the APCs, in addition to a detected concentration detected by a corresponding one of the plurality of the gas densitometers.

3. The gas generation apparatus according to claim 1, wherein
    said raw material gas includes an oxygen gas, and said output gas includes an ozone gas, and
    said gas generator is an ozone generator that generates the ozone gas from the oxygen gas, and said plurality of gas generator units are a plurality of ozone gas generator units.

4. The gas generation apparatus according to claim 1, wherein
    said raw material gas includes a plurality of types of raw material gases that are different from each other,
    said gas control section includes a raw material gas passage provided such that each of said plurality of types of raw material gases is supplied to a corresponding gas generator unit of said plurality of gas generator units, and
    said output gas includes a plurality of types of output gases corresponding to said plurality of types of raw material gases.

5. The gas generation apparatus according to claim 4, wherein said plurality of types of raw material gases include a first partial raw material gas that is an oxygen gas, and a mixed raw material gas in which a second partial raw material gas that is at least one of a carbon-based gas, a hydrogen-based gas, a nitrogen-based gas, and a fluorine-based gas is added to said first partial raw material gas.

6. The gas generation apparatus according to claim 1, further comprising
    an external gas generator unit that is provided outside separately from said plurality of gas generator units, said multiple AC power supply section, said gas control section, and said AC power supply control section, the external gas generator unit including a gas generator, wherein
    said multiple AC power supply section further supplies an external AC voltage to said external gas generator unit,
    said gas control section controls an output gas generated by said external gas generator unit,
    said gas control section further includes:
        an external MFC that controls a raw material gas flow rate that is a flow rate of a raw material gas input to said external gas generator unit; and
        an external APC that controls an internal pressure that is a pressure inside the gas generator of said external gas generator unit,
    said external MFC detects the raw material gas flow rate input to said external gas generator unit as an external detected gas flow rate, and said external APC detects a pressure on an input side of said external gas generator unit as an external detected pressure, and said AC power control operation performed by said AC power supply control section further includes an operation of controlling electric energy of said external AC voltage, based on the external detected gas flow rate detected by said external MFC and the external detected pressure detected by said external APC.

7. The gas generation apparatus according to claim 6, wherein the output gas generated by said plurality of gas generator units includes at least one of an ozone gas, an oxygen gas, a hydrogen gas, a nitrogen gas, and a fluorine gas, the output gas generated by said external gas generator unit includes at least one radical gas of an oxygen radical gas, a hydrogen radical gas, a nitrogen radical gas, and a fluorine radical gas, and said external gas generator unit is directly connected to a gas treatment apparatus provided outside such that the radical gas is directly output to the gas treatment apparatus.

8. The gas generation apparatus according to claim 1, further comprising an external gas generator unit that is provided outside separately from said plurality of gas generator units, said multiple AC power supply section, said gas control section, and said AC power supply control section, the external gas generator unit including a gas generator.

9. The gas generation apparatus according to claim 8, wherein said multiple AC power supply section further supplies an external AC voltage to said external gas generator unit, and said gas control section controls an output gas generated by said external gas generator unit.

10. The gas generation apparatus according to claim 9, wherein said gas control section further includes:

an external MFC that controls a raw material gas flow rate that is a flow rate of a raw material gas input to said external gas generator unit; and an external APC that controls an internal pressure that is a pressure inside the gas generator of said external gas generator unit, said external MFC detects the raw material gas flow rate input to said external gas generator unit as an external detected gas flow rate, and said external APC detects a pressure on an input side of said external gas generator unit as an external detected pressure.

* * * * *